United States Patent
Tsai et al.

(10) Patent No.: US 9,263,300 B2
(45) Date of Patent: Feb. 16, 2016

(54) ETCH BACK PROCESSES OF BONDING MATERIAL FOR THE MANUFACTURE OF THROUGH-GLASS VIAS

(71) Applicant: CORNING INCORPORATED, Corning, NY (US)

(72) Inventors: Chih-Wei Tsai, Taipei (TW); Bor Kai Wang, New Taipei (TW)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 14/699,393

(22) Filed: Apr. 29, 2015

(65) Prior Publication Data

US 2015/0318187 A1 Nov. 5, 2015

Related U.S. Application Data

(60) Provisional application No. 61/986,370, filed on Apr. 30, 2014.

(51) Int. Cl.
*B23P 15/00* (2006.01)
*C03C 25/00* (2006.01)
*C23F 1/00* (2006.01)
*H01L 21/48* (2006.01)
*C03C 15/00* (2006.01)

(52) U.S. Cl.
CPC .............. *H01L 21/486* (2013.01); *C03C 15/00* (2013.01)

(58) Field of Classification Search
CPC .............................. H01L 21/486; C03C 15/00
USPC ......................................................... 216/2, 39
See application file for complete search history.

(56) References Cited

U.S. PATENT DOCUMENTS

| | | | |
|---|---|---|---|
| 8,411,459 B2 | 4/2013 | Yu et al. | 361/783 |
| 2006/0292877 A1 | 12/2006 | Lake | 438/694 |
| 2011/0229687 A1 | 9/2011 | Gu et al. | 428/131 |
| 2013/0247615 A1 | 9/2013 | Boek et al. | 65/29.1 |
| 2014/0116091 A1 | 5/2014 | Chuang et al. | 65/31 |
| 2014/0147623 A1 | 5/2014 | Shorey et al. | 428/137 |
| 2015/0173191 A1 | 6/2015 | Takahashi | |

FOREIGN PATENT DOCUMENTS

| | | |
|---|---|---|
| WO | 2012011230 | 1/2012 |
| WO | 2014038326 | 3/2014 |

OTHER PUBLICATIONS

Patent Cooperation Treaty International Notification of Transmittal of the International Search Report and the Written Opinion of the International Searching Authority, international application No. PCT/US2015/028200: mailing date Sep. 14, 2015, 9 pages.

*Primary Examiner* — Roberts Culbert
(74) *Attorney, Agent, or Firm* — John T. Haran

(57) ABSTRACT

A method for manufacturing vias in a glass substrate includes bonding, through a bonding layer, a first face of the glass substrate including a plurality of holes to a first face of a glass carrier. The bonding layer has a thickness t between the first face of the glass substrate and the first face of the glass carrier and extends into at least some of the plurality of holes to a depth h from the first face of the glass substrate. The method includes etching back the bonding layer to a depth d through the plurality of holes in the glass substrate. The depth d is less than the sum of the thickness t and the depth h. The method can include filling the plurality of holes with an electrically conductive material, and de-bonding the glass substrate from the bonding layer and the glass carrier.

20 Claims, 5 Drawing Sheets

ETCH BACK PROCESSES OF BONDING MATERIAL FOR THE MANUFACTURE OF THROUGH-GLASS VIAS

This application claims the benefit of priority under 35 U.S.C. §119 of U.S. Provisional Application Ser. No. 61/986,370 filed on Apr. 30, 2014 the content of which is relied upon and incorporated herein by reference in its entirety.

BACKGROUND

1. Field

The present specification generally relates to the manufacture of through glass vias and, more specifically, to etching processes used to manufacture through glass vias.

2. Technical Background

Through-substrate vias provide electrical connections between layers in a physical electronic circuit or chip. For example, in a three-dimensional stacked integrated circuit, the through-substrate vias enable integration of electronic components both vertically and horizontally. Conventionally, through-substrate vias employ a silicon substrate. However, because glass is less expensive than silicon, glass substrates are becoming more prevalent in electronic devices.

While a reduced cost, a flexible coefficient of thermal expansion, and the inherent insulation properties of glass make the choice of glass as a substrate an attractive option, the use of glass presents several challenges. In particular, one challenge of using a glass substrate is the handling of a suitably thin piece of glass during the manufacturing process. Another challenge is forming holes in a glass substrate at a high rate of speed without cracking the glass at the entrance holes and without adversely affecting metallization of the vias.

Accordingly, a need exists for alternative methods for forming through-glass vias which enhance manufacturability and achieve reliable metallization of the vias.

SUMMARY

According to one embodiment, a method for manufacturing a plurality of vias in a substrate includes bonding a first face of the substrate including a plurality of holes to a first face of a carrier using a bonding layer. The bonding layer has a thickness t between the first face of the substrate and the first face of the carrier and extends into at least some of the plurality of holes to a depth h from the first face of the glass substrate. The method also includes etching the bonding layer to a depth d through the plurality of holes in the substrate. The depth d is less than the sum of the thickness t and the depth h. The method also includes filling the plurality of holes with a material to form the plurality of vias.

In another embodiment, a method for manufacturing a plurality of vias in a substrate includes bonding a first face of the gsubstrate including a plurality of holes to a first face of a carrier, etching the bonding layer to a depth d through the plurality of holes in the substrate using a wet etch process, filling the plurality of holes with an electrically conductive material to form the plurality of vias in the substrate, and de-bonding the glass substrate including the plurality of vias from the bonding layer and the carrier. The first face of the substrate is bonded to the glass carrier through a bonding layer. The bonding layer has a thickness t between the first face of the substrate and the first face of the carrier, and the depth d is measured from the first face of the substrate. The depth d is less than the thickness t. The electrically conductive material extends into the bonding layer by the depth d such that when the substrate is de-bonded from the bonding layer and the carrier, the electrically conductive material protrudes from the first face of the substrate.

In another embodiment, a method for manufacturing a plurality of vias in a substrate includes bonding a first face of the substrate including a plurality of holes to a first face of a carrier through a bonding layer, etching the bonding layer to a depth d using a dry etch process, filling the plurality of holes with an electrically conductive material to form the plurality of vias in the substrate, and de-bonding the substrate including the plurality of vias from the bonding layer and the carrier. The bonding layer has a thickness t between the first face of the substrate and the first face of the carrier. The depth d is measured from the first face of the substrate and is equal to the thickness t. The first face of the carrier is a stop layer for the dry etch process. When the substrate is de-bonded from the bonding layer and the carrier, the electrically conductive material forms pillars extending from the first face of the substrate a length l, wherein the length l is equal to the thickness t of the bonding layer.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
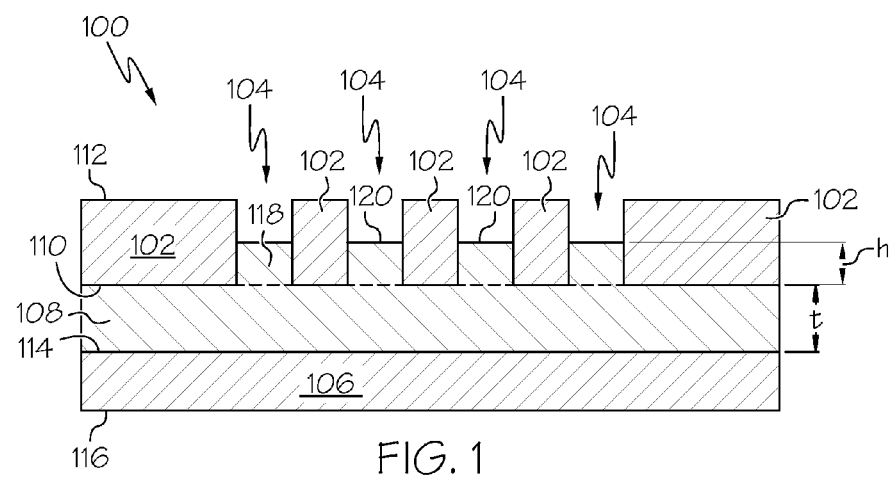
FIG. 1 schematically depicts a glass substrate including a plurality of holes bonded to a glass carrier through a bonding layer in accordance with one or more embodiments.

Reference will now be made in detail to various embodiments, examples of which are illustrated in the accompanying drawings. Whenever possible, the same reference numerals will be used throughout the drawings to refer to the same or like parts. One embodiment of components used in the method of the present disclosure is shown in FIG. 1, and is designated generally throughout by the reference numeral 100. The components generally may include a glass substrate including a plurality of holes bonded to a glass carrier through a bonding layer. The bonding layer may be etched through the plurality of holes, filled with an electrically conductive material, and the glass substrate may be de-bonded from the glass carrier.

The methods of the present disclosure enable through-glass vias to be manufactured in the glass substrate despite challenges associated with handling of the glass substrate. For example, by bonding the glass substrate to a glass carrier, challenges associated with handling a thin glass substrate may be alleviated. In addition, various embodiments may leverage existing semiconductor processes and process flow while resulting in more effective metallization.

In the embodiment shown in FIG. 1, the glass substrate 102 including a plurality of holes 104 is bonded to a glass carrier 106 through a bonding layer 108. The glass substrate 102 may be used, for example, as an interposer to provide electrical connections within a three-dimensional chip. The glass substrate 102 includes a first face 110 and a second face 112 opposite the first face 110. Similarly, the glass carrier 106 includes a first face 114 and a second face 116 opposite the first face 114. The glass carrier 106 may enable manufacturers to reduce a thickness of the glass substrate 102 without altering their existing manufacturing processes or facilities. After vias are formed within the glass substrate 102, the glass substrate 102 is separated from the glass carrier 106 and the glass carrier 106 may be discarded or reused in the handling of a subsequent glass substrate. The first face 110 of the glass substrate 102 is separated from the first face 114 of the glass carrier 106 by a thickness t of the bonding layer 108.

The composition and dimensions of the glass substrate 102 are not particularly limited, and are selected based on the desired end use of the glass substrate 102. The glass substrate 102 may be, for example, Eagle XG glass, or Code 2318 glass, manufactured by Corning, Inc. or the like. Additionally, the glass substrate 102 may be in the shape of a wafer having a 4 inch, 6 inch, 8 inch, or 12 inch diameter, for example. Alternatively, the glass substrate 102 may be in the form having any dimensions suitable for its end use. The thickness of the glass substrate 102 may also vary depending on its end use. For example, the glass substrate 102 may have a thickness of from about 30 µm to about 1000 µm, from about 40 µm to about 500 µm, from about 50 µm to about 200 µm, or about 100 µm. In various embodiments, the glass substrate 102 has a thickness of less than or equal to about 100 µm. In some embodiments, the glass substrate 102 has a thickness of less than 100 µm. It should be understood that a glass substrate of any suitable thickness may be utilized.

The plurality of holes 104 can be formed in the glass substrate 102 by any suitable method. For example, in various embodiments, the plurality of holes 104 is drilled in the glass substrate 102 using a pulsed laser beam. The laser beam may be any laser beam having optical properties capable of drilling a sacrificial cover layer and the glass substrate 102, such as an ultra-violet (UV) laser beam that is a frequency tripled neodymium dopes yttrium orthovanadate (Nd:YVO$_4$) laser, which emits a wavelength of about 355 nm. The laser beam may be pulsed at a predetermined location to form each of the plurality of holes 104 in the glass substrate 102. The plurality of holes may also be mechanically machined in some embodiments.

As illustrated in FIG. 1, the glass substrate 102 is bonded to the glass carrier 106. The glass substrate 102 and the glass carrier 106 may be bonded using a variety of adhesive materials and may or may not be UV-curable adhesives. The bonding layer may be a commercially-available adhesive from TOK, BS, 3M, or DuPont, including but not limited to, 3M UV-Curable Adhesive LC-3200, 3M UV-Curable Adhesive LC-4200, or 3M UV-Curable Adhesive LC-5200. In various embodiments, an adhesive is applied to one or both of the first face 110 of the glass substrate 102 and the first face 114 of the glass carrier 106. The first face 110 of the glass substrate 102 is brought into contact with the first face 114 of the glass carrier 106. For example, the adhesive layer can be spin-coated onto one or both of the first face 110 of the glass substrate and the first face 114 of the glass carrier 106. Pressure and/or heat may be applied to the glass substrate 102 and the glass carrier 106 to bond the glass substrate 102 and the glass carrier 106 through the bonding layer 108.

In various embodiments, the application of pressure to the glass substrate 102 and the glass carrier 106 during bonding causes the bonding layer 108 to extend into at least some of the plurality of holes 104, forming an adhesive plug 118. As shown in FIG. 1, the adhesive plug 118 extends into the plurality of holes 104 to a height h, as measured from the first face 110 of the glass substrate 102 to a distal face 120 of the adhesive plug 118. Accordingly, the bonding layer 108 may have a thickness t between the first face 110 of the glass substrate and the first face 114 of the glass carrier 106, and a thickness of t plus h inside the plurality of holes 104, as measured from the distal face 120 of the adhesive plug 118 to the first face 114 of the glass carrier 106.

After the glass substrate 102 is bonded to the glass carrier 106, an etch-back process is employed to remove the adhesive plug 118. Removal of the adhesive plug 118 from within the plurality of holes 104 serves to further shape the plurality of holes 104 by removing resin and glass fibers so that when the plurality of holes is filled with electrically conductive material, the electrically conductive material can smoothly and completely coat the interior of the holes, thus forming an effective connection between layers on either side of the glass substrate.

Figure 2:
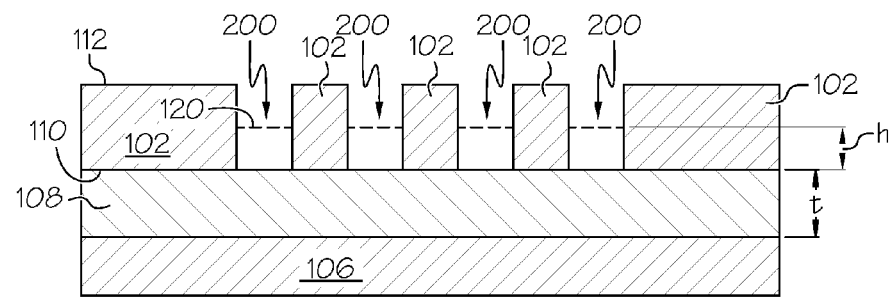
FIG. 2 schematically depicts a cross-section of a process of etching back the bonding layer through the plurality of holes in the glass substrate depicted in FIG. 1 in accordance with one or more embodiments.

As shown in FIG. 2, an etchant 200 is introduced through the plurality of holes 104 at the second face 112 of the glass substrate 102. The etching process is not particularly limited and can include wet etching processes or dry etching processes.

In various embodiments, a wet etch process is employed to etch back the bonding layer 108. In such embodiments, the etchant 200 may be an etching solvent. The bonding layer 108 can be exposed to the etching solvent through the plurality of holes 104. The glass substrate 102 functions as a hard mask for the etching process. For example, each adhesive plug 118 and portions of the bonding layer 108 extending from the adhesive plug 118 to the first face 114 of the glass carrier 106 may be exposed to the etchant 200, while portions of the bonding layer 108 between the first face 110 of the glass substrate 102 and the first face 114 of the glass carrier 106 where there is no hole may not be exposed to the etchant 200. Accordingly, the portions of the bonding layer 108 that extend into the plurality of holes 104 (making up the adhesive plugs 118) and between the adhesive plugs 118 and the first face 114 of the glass carrier 106 may be etched away while the other portions of the bonding layer 108 remain.

The etching solvent may include, but is not limited to, at least one of hydrofluoric acid, ammonium fluoride, nitric acid, acetic acid, acetone, or combinations thereof. In various embodiments, the etching solvent can include buffered oxide etch (i.e., BOE, buffered HF, or BHF) or acetone. Other etching solvents may be employed, depending on the particular adhesive material in the bonding layer and the particular glass composition of the glass substrate 102 and the glass carrier 106. In particular, suitable etching solvents have high selectivity between the bonding layer 108 and the glass of the glass substrate 102 and the glass carrier 106. The etching solvent may be sprayed on to the glass substrate 102 or the components 100 may be immersed in the etching solvent.

In other embodiments, a dry etch process is employed to etch back the bonding layer 108. In such embodiments, a plasma etcher may be utilized to etch back the bonding layer 108 using a plasma generated from an $O_2$ or Argon-containing gas. Other dry etching processes may be employed. The dry etch process may be controlled by time or it can be stopped when the etching reaches the glass carrier 106.

Whether the etching is performed using a wet etch process or a dry etch process, the bonding layer 108 inside the plurality of holes 104 is etched back through the distal face 120 of the adhesive plugs 118 such that the adhesive plugs 118 are removed, as shown in FIG. 2. The duration of the etching process is not limited and may be determined based on the etch rate and the desired depth of etch back.

Figure 3A:
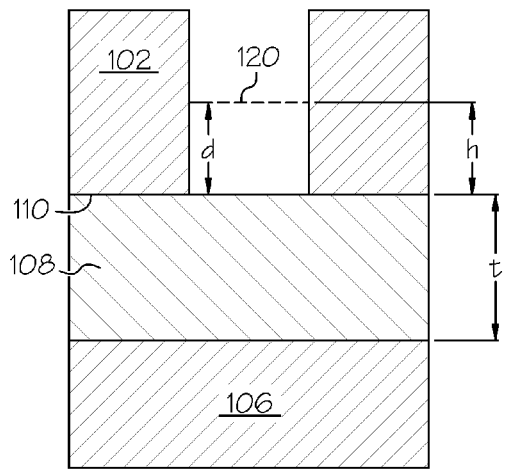
FIG. 3A schematically depicts a cross-section of a process of etching back the bonding layer to a depth d that is equal to a height h of a distal face of the bonding layer within the plurality of holes in the glass substrate in accordance with one or more embodiments.
Figure 3B:
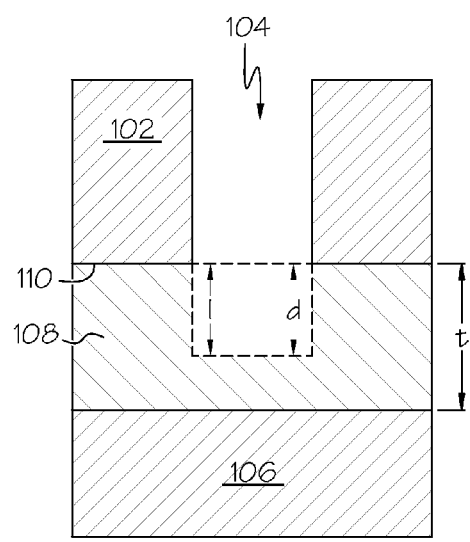
FIG. 3B schematically depicts a cross-section of a process of etching back the bonding layer to a depth d that extends a length l into the bonding layer in accordance with one or more embodiments.
Figure 3C:
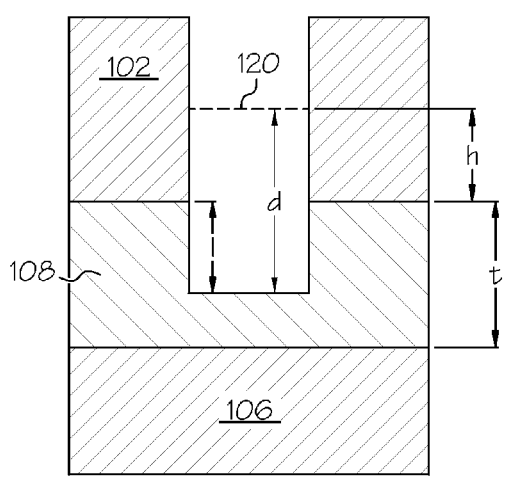
FIG. 3C schematically depicts a cross-section of a process of etching back the bonding layer to a depth d that is equal to the sum of the height h of a distal face of the bonding layer within the plurality of holes in the glass substrate and length l into the bonding layer in accordance with one or more embodiments.

As shown in FIGS. 3A-3C, in various embodiments, the bonding layer 108 is etched backed to a depth d through the plurality of holes 104. As used herein, the depth d represents the depth into the bonding layer 108 measured from the distal face 120 of the adhesive plug 118 (e.g., the sum of the depth h plus at least a portion of the thickness t). For example, when the etch back process is used to etch back only the adhesive making up the adhesive plugs 118 and does not etch adhesive material of the bonding layer 108 past the first face 110 of the glass substrate 102, the depth d is equal to the height h of the adhesive plug 118, as shown in FIG. 3A. In some embodiments, such as where the bonding layer 108 does not extend into the plurality of holes 104, the depth d is less than or equal to the thickness t of the bonding layer 108, as shown in FIG. 3B. When the etch back process is used to etch back the adhesive plugs 118 and further etches at least partially through the thickness t of the bonding layer 108, the depth d is equal to the sum of the height h plus the portion of the thickness t, as shown in FIG. 3C. In various embodiments, the length l represents the length into the bonding layer 108 the etching extends, as measured from the first face 110 of the glass substrate 102. For example, in FIG. 3B, the length l is equal to the depth d, because there was no adhesive plug (e.g., the height h is equal to zero). In FIG. 3C, the length l is equal to the difference between the depth d and the height h. Accordingly, the depth d is equal to the sum of the height h of the adhesive plug, if any, and the length l.

Once the etching process is complete, the plurality of holes 104 is filled with an electrically conductive material. The electrically conductive material may be, by way of example and not limitation, copper, silver, aluminum, nickel, alloys thereof, and combinations thereof. In some embodiments, the plurality of holes 104 is filled with a copper-containing material, such as a copper alloy.

The filling process may be any suitable metal filling process, including but not limited to, a wave soldering process, physically placing a solder paste into the plurality of holes, a vacuum solder technique, or any other metal filling technique known or used in the art. In some embodiments, a physical vapor deposition (PVD, or sputtering) or chemical vapor deposition process may be used to coat the interior walls of the plurality of holes 104 with electrically conductive material to form an electrically conductive layer prior to filling the plurality of holes 104 with the electrically conductive material. In other embodiments, deposition of the electrically conductive layer may include an electroless or electrolytic plating process. In such embodiments, a seed layer may be formed on the interior walls of the plurality of holes 104 before the electrically conductive material is plated. For example, a seed layer may be deposited, followed by a copper deposition process to form an electrically conductive layer on the interior walls of the plurality of holes 104. Although some filling processes may include formation of an electrically conductive layer prior to filling the plurality of holes 104, formation of the electrically conductive layer may not be necessary in some embodiments. For example, when vacuum methods are employed to fill the plurality of holes 104, plating of an electrically conductive layer may be eliminated.

Figure 4A:
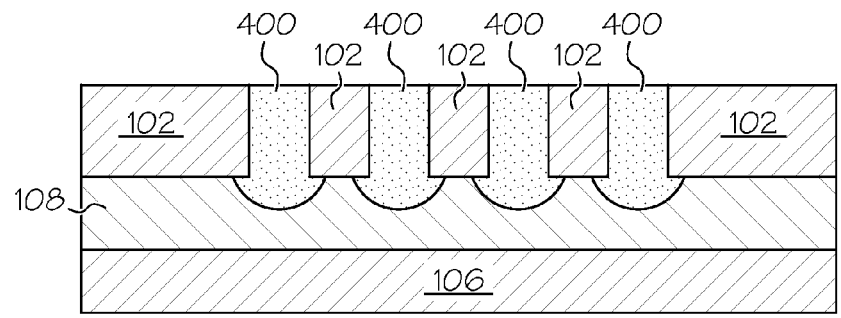
FIG. 4A schematically depicts a cross-section of a metal filling process in which the electrically conductive material forms a plurality of vias having a mushroom shape in accordance with one or more embodiments.
Figure 4B:
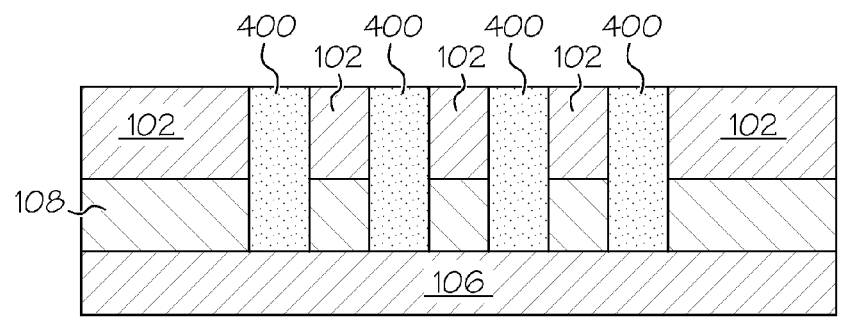
FIG. 4B schematically depicts a cross-section of a metal filling process in which the electrically conductive material forms a plurality of vias having a pillar shape in accordance with one or more embodiments.
Figure 4C:
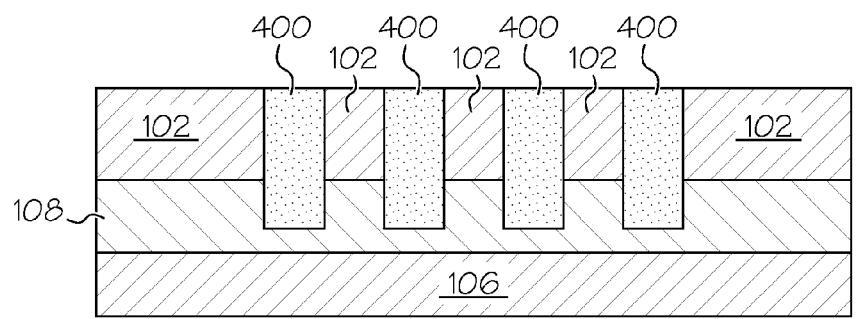
FIG. 4C schematically depicts a cross-section of a metal filling process in which the electrically conductive material forms a plurality of vias having a pillar shape in accordance with one or more embodiments.

FIGS. 4A-4C schematically depict a cross-section of a process of filling the plurality of holes 104 with an electrically conductive material. When the plurality of holes 104 are filled with the electrically conductive material, the electrically conductive material may completely fill the portion of the bonding layer 108 that was etched back and the plurality of holes 104. At least a portion of the electrically conductive material may protrude from the first face 110 of the glass substrate 102, extending into the bonding layer 108 to the length l to form a plurality of vias 400 in the glass substrate 102. As shown in FIG. 4A, in some embodiments, such as when a wet-etch process is used, the electrically conductive material may fill a mushroom-shaped void created by the etching process such that the vias 400 include a portion of the electrically conductive material that protrudes from the first face 110 of the glass substrate 102.

In other embodiments, such as the embodiment depicted in FIGS. 4B and 4C, the etching process may form a one directional void. For example, when a dry-etch process is employed, the bonding layer may only be etched in a single direction such that the void will not expand laterally beyond the first face 110 of the glass substrate 102. Accordingly, the electrically conductive material may form a pillar-shaped void, resulting in a pillar-shaped via 400, as shown in FIGS. 4B and 4C. In other words, the via 400 may have the shape of a cylinder having substantially parallel sides that extend from the first face 110 of the glass substrate 102 in a direction that is substantially perpendicular with the first face 110 of the glass substrate 102. In embodiments in which the dry-etch process utilizes the first face 114 of the glass carrier 106 as a stop layer, the bonding layer 108 is etched to a length l that is equal to the thickness t of the bonding layer 108 and the pillar-shaped via 400 may extend from the first face 100 of the glass substrate 102 the length l, as shown in FIG. 4B. When the dry-etch process is controlled by time, the bonding layer 108 may be etched back to a length l into the bonding layer 108, where the length l is less than the thickness t of the bonding layer 108, and the pillar-shaped via 400 may extend from the first face 100 of the glass substrate 102 the length l, as shown in FIG. 4C.

Figure 5A:
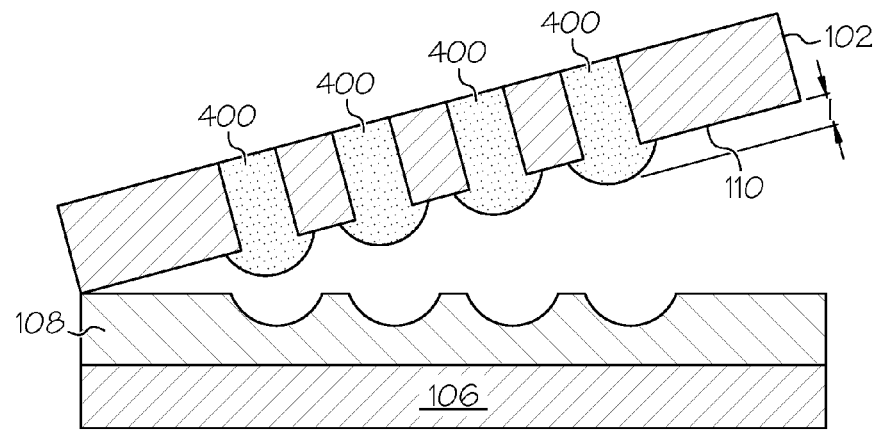
FIG. 5A schematically depicts a cross-section of a de-bonding process of the glass substrate having a plurality of mushroom-shaped vias in accordance with the embodiment shown in FIG. 4A.
Figure 5B:
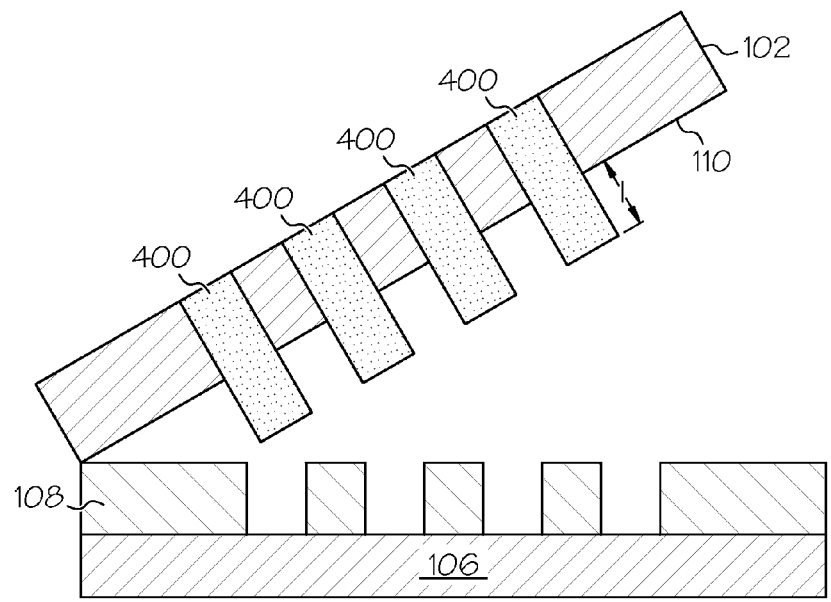
FIG. 5B schematically depicts a cross-section of a de-bonding process of the glass substrate having a plurality of pillar-shaped vias in accordance with the embodiment shown in FIG. 4B.
Figure 5C:
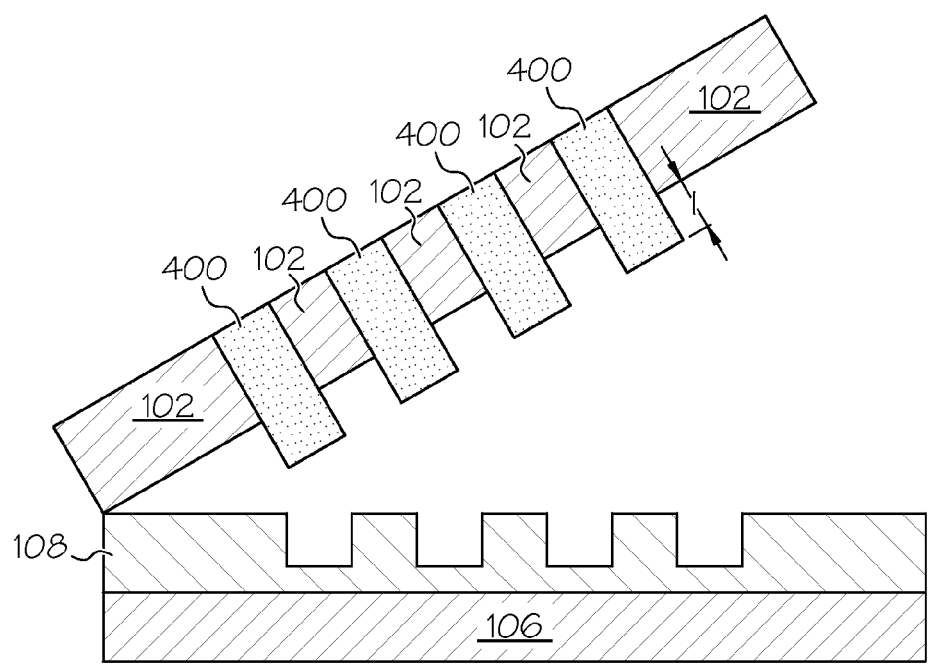
FIG. 5C schematically depicts a cross-section of a de-bonding process of the glass substrate having a plurality of pillar-shaped vias in accordance with the embodiment shown in FIG. 4C.

Once the plurality of holes 104 are filled with the electrically conductive material 400, the glass substrate 102 may be de-bonded from the bonding layer 108 and the glass carrier 106, as shown in FIGS. 5A-5C. De-bonding may be performed using any suitable process. For example, in embodiments in which the bonding layer 108 comprises a UV-cured adhesive, a laser may be used to destroy the bonds between the adhesive and the glass substrate 102. Other laser and baking methods may be employed to separate the bonding layer 108 from the glass substrate 102. Alternatively or in addition, dicing tape may be applied to the glass substrate 102 during the de-bonding process prior to using a laser to de-bond the glass substrate 102 from the glass carrier 106. In some embodiments, the glass carrier 106 may first be de-bonded from the bonding layer 108, and then the bonding layer 108 may be removed from the glass substrate 102 including the plurality of vias 400.

In various embodiments, the de-bonding process leaves substantially no adhesive residue on the glass substrate 102 including the plurality of vias 400. For example, the de-bonding process may include a step in which de-taping tape (available from 3M) is used to peel the adhesive from the first face 110 of the glass substrate 102.

FIG. 5A illustrates the embodiment of FIG. 4A during the de-bonding process. In particular, the plurality of vias 400 protrude from the first face 110 of the glass substrate 102 when the glass substrate 102 is de-bonded. In embodiments in which the bonding layer 108 was etched to the length l, the electrically conductive material protrudes from the first face 110 of the glass substrate 102 the length l. Similarly, FIG. 5B and FIG. 5C illustrate the embodiments of FIG. 4B and FIG. 4C, respectively, during the de-bonding process. In FIGS. 5B and 5C, the plurality of vias 400 are pillar shaped, and extend from the first face 100 of the glass substrate 102. In embodiments in which the bonding layer 108 was etched to the length l into the bonding layer 108, the pillars extend from the first face 110 of the glass substrate 102 the length l. For example, in FIG. 5B, the length l is equal to the thickness t of the bonding layer. In FIG. 5C, the length l is less than the thickness t of the bonding layer.

It should now be understood that embodiments of the present disclosure enable through-glass vias to be formed in a thin glass substrate while leveraging the existing manufacturing processes in the semiconductor industry. In particular, various embodiments enable the glass substrate to be removably coupled to a glass carrier for handling. In various embodiments, the etching back of the bonding layer further leverages the glass substrate and the glass carrier to simplify the etching process by reducing or even eliminating the need for an additional mask and/or stop layer.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method for manufacturing a plurality of vias in a substrate, the method comprising:
    bonding a first face of the substrate including a plurality of holes to a first face of a carrier with a bonding layer, wherein the bonding layer has a thickness t between the first face of the substrate and the first face of the carrier and extends into at least some of the plurality of holes to form adhesive plugs having a height h from the first face of the substrate;
    etching the bonding layer to a depth d through the plurality of holes in the substrate, wherein the depth d is less than or equal to the sum of the thickness t and the height h; and
    filling the plurality of holes with a material to form the plurality of vias.

2. The method of claim 1 further comprising forming the plurality of holes in the substrate by drilling using a pulsed laser beam.

3. The method of claim 1, wherein etching the bonding layer comprises utilizing a wet etch process.

4. The method of claim 1, wherein etching the bonding layer comprises utilizing a dry etch process.

5. The method of claim 1, wherein:
    the material is an electrically conductive material that extends into the bonding layer a length l, wherein the length l is equal to the difference between the depth d and the height h; and
    the method further comprises de-bonding the substrate including the plurality of vias from the bonding layer and the carrier, wherein a portion of the electrically conductive material forming the plurality of vias protrudes from the first face of the substrate.

6. The method of claim 5, wherein the depth d is equal to the sum of the thickness t of the bonding layer and the height h, such that the length l is equal to the thickness t.

7. A method for manufacturing a plurality of vias in a substrate, the method comprising:
    bonding a first face of the substrate including a plurality of holes to a first face of a carrier with a bonding layer, wherein the bonding layer has a thickness t between the first face of the substrate and the first face of the carrier;
    etching, using a wet etch process, the bonding layer to a depth d through the plurality of holes in the substrate;
    filling the plurality of holes with an electrically conductive material to form the plurality of vias in the substrate, wherein the electrically conductive material extends into the bonding layer by a length l, and wherein the length l is less than the thickness t; and
    de-bonding the substrate including the plurality of vias from the bonding layer and the carrier, wherein the electrically conductive material protrudes from the first face of the substrate.

8. The method of claim 7, wherein the substrate has a thickness of less than or equal to 100 μm.

9. The method of claim 8, wherein the thickness of the substrate is less than 100 μm.

10. The method of claim 7, wherein the wet etch process comprises exposing the bonding layer to a solvent selected from HF and acetone.

11. The method of claim 10, wherein the bonding layer is exposed to the solvent through the substrate such that the substrate is a hard mask for the etching process.

12. The method of claim 11, wherein the substrate has a thickness of less than or equal to 100 μm.

13. The method of claim 12, wherein the electrically conductive material comprises a copper material.

14. The method of claim 13, the method further comprising incorporating the substrate including the plurality of vias into a three-dimensional stacked integrated circuit.

15. A method for manufacturing a plurality of vias in a substrate, the method comprising:
bonding a first face of the substrate including a plurality of holes to a first face of a carrier using a bonding layer, wherein the bonding layer has a thickness t between the first face of the substrate and the first face of the carrier;
etching, using a dry etch process, the bonding layer to a depth d through the plurality of holes in the substrate, wherein the depth d is equal to the sum of a length l into which the etching extended into the bonding layer from the first face of the substrate and a height h of an adhesive plug formed by the bonding layer extending into at least some of the plurality of holes, wherein the length l is equal to the thickness t, the first face of the carrier being a stop layer for the dry etch process;
filling the plurality of holes with an electrically conductive material to form the plurality of vias in the substrate, wherein the electrically conductive material extends through the bonding layer to the first face of the carrier; and
de-bonding the substrate including the plurality of vias from the bonding layer and the carrier, wherein the electrically conductive material forms pillars extending from the first face of the substrate the length l.

16. The method of claim 15, wherein the dry etch process comprises exposing the bonding layer to a plasma generated from one of an $O_2$ or Argon-containing gas.

17. The method of claim 15, wherein the electrically conductive material comprises copper.

18. The method of claim 15, wherein each of the pillars comprises a cylinder extending from the first face of the substrate extends in a direction that is substantially perpendicular with the first face of the substrate.

19. The method of claim 15, wherein the substrate has a thickness of less than or equal to 100 μm.

20. The method of claim 19, wherein the thickness of the substrate is less than 100 μm.

\* \* \* \* \*